United States Patent
Dacus et al.

(10) Patent No.: US 6,223,061 B1
(45) Date of Patent: Apr. 24, 2001

(54) APPARATUS FOR LOW POWER RADIO COMMUNICATIONS

(75) Inventors: Farron L. Dacus, Irving, TX (US); Robert N. Schmidt, Cleveland; Steven P. Hendrix, Sagamore Hills, both of OH (US)

(73) Assignee: Cleveland Medical Devices Inc., Cleveland, OH (US)

( * ) Notice: Subject to any disclaimer, the term of this patent is extended or adjusted under 35 U.S.C. 154(b) by 0 days.

(21) Appl. No.: 08/900,329

(22) Filed: Jul. 25, 1997

(51) Int. Cl.[7] .................................................. H04B 1/00
(52) U.S. Cl. ........................................... 455/574; 455/522
(58) Field of Search ..................................... 455/119, 38.3, 455/180.3, 180.4, 260, 522, 574; 375/211, 223, 272, 303, 334; 331/14, 17, 23, 41; 332/10, 127

(56) References Cited

U.S. PATENT DOCUMENTS

| | | | |
|---|---|---|---|
| 3,393,380 | | 7/1968 | Webb ...................................... 332/19 |
| 3,882,277 | * | 5/1975 | DePedro et al. ................. 379/106.02 |
| 4,092,602 | * | 5/1978 | Nishioka et al. ..................... 455/263 |
| 4,392,113 | * | 7/1983 | Jackson .............................. 331/36 C |
| 4,481,489 | * | 11/1984 | Kurby ..................................... 331/23 |
| 4,498,191 | * | 2/1985 | Rogers .............................. 455/164.2 |
| 4,521,918 | * | 6/1985 | Challen ................................... 331/17 |
| 4,609,886 | * | 9/1986 | Takaki et al. ......................... 332/127 |
| 4,612,511 | * | 9/1986 | Naito et al. ......................... 331/36 C |
| 4,866,404 | * | 9/1989 | Vandergraaf ......................... 332/127 |
| 4,868,523 | * | 9/1989 | Petersson ................................ 331/14 |
| 5,097,230 | | 3/1992 | Lautzenhiser ....................... 332/127 |
| 5,225,794 | * | 7/1993 | Sklka et al. ............................ 331/17 |
| 5,379,002 | | 1/1995 | Jokura .................................... 331/10 |
| 5,483,695 | * | 1/1996 | Pardoen ............................... 455/314 |
| 5,493,257 | | 2/1996 | Chadwick ............................ 332/100 |
| 5,691,657 | * | 11/1997 | Hirano et al. ........................... 327/94 |
| 5,732,110 | * | 3/1998 | Richards et al. ..................... 375/334 |
| 5,767,791 | * | 6/1998 | Stoop et al. .......................... 455/119 |

OTHER PUBLICATIONS

Gardner, Floyd M. Phaselock Techniques, John Wiley and Sons, ISBN 0–471–04294–3 pp. 8–11, 1979.*

* cited by examiner

Primary Examiner—Reinhard Eisenzopf
Assistant Examiner—Makoto Aoki

(57) ABSTRACT

An apparatus for low power radio communication comprising a transmitter having a frequency synthesizer and transmit antenna such that the frequency synthesizer comprises a phase locked loop circuit with a voltage controlled oscillator having a variable frequency output and with a loop filter/sample and hold circuit that allows opening of the synthesizer control loop and with special means of limiting the resulting frequency drift in the open loop state. The transmitter produces an output signal and the loop filter/sample and hold circuit holds the voltage controlled oscillator substantially on frequency such that the output signal remains stable, with a minimum of frequency drift, over a period of time when the phase lock loop synthesizer is set to an open loop state to allow frequency modulation unimpeded by the normal frequency correcting action of the synthesizer and for the frequency synthesizer to be partially powered down to reduce power consumption. The frequency modulation is linearized over a band of interest and undesired frequency shift at the initiation of modulation is suppressed. Receiver having automatic frequency control is included to extend the open loop transmit time of the transmitter, where the automatic frequency control system automatically tunes the receiver to correct for frequency error and for the frequency drift resulting from opening the phase locked loop of the frequency synthesizer, allowing communications to continue in the presence of such drift and of other frequency error.

1 Claim, 10 Drawing Sheets

APPARATUS FOR LOW POWER RADIO COMMUNICATIONS

This invention was made as a result of work under Contract 1R43AG13818-01 between the U.S. Department of Health and Human Services and Cleveland Medical Devices, Inc. and the U.S. government has rights in this invention pursuant thereto.

BACKGROUND OF THE INVENTION

The present invention relates generally to the field of low power digital wireless communications and, more specifically, to radio communication links that provide for low power consumption and compact size while maintaining accurate frequency synthesized tuning and effective performance.

The purpose of frequency synthesis is the generation of radio waveforms whose frequency is conveniently and accurately controlled. Frequency accuracy is important for state-of-the-art radio equipment to allow for the efficient use of the radio spectrum by exact placement of the transmit frequency. This allows channels to be tightly packed and for minimum receiver bandwidth and, thus, higher sensitivity for a given data rate. Frequency synthesis using the phase locked loop (PLL) technique is the dominant method to provide for such accuracy. The fundamental operation of PLL frequency synthesis is well known, described, and analyzed in the literature, such as R. Best, *Phase Locked Loops, Theory, Design, and Applications*, New York: McGraw Hill, 1984.

The PLL frequency synthesizing approach is based on a feedback control system with phase as the control variable. The phase of the desired output signal is forced to be a constant in this system. Because frequency is, by definition, the mathematical derivative of phase with respect to time, frequency error is forced to zero when phase error is held constant. In the circuit implementation of a PLL, the phase of a block consisting of a voltage controlled oscillator (VCO) followed by a frequency divider is, by use of negative feedback, kept matched to the phase of a block consisting of a crystal controlled oscillator (XCO) followed by a different divider. The two divider outputs drive a phase detector that outputs a signal proportional to the phase difference between the inputs. The phase detector output is filtered by a loop filter to remove excess noise. The filtered output steers the VCO by its control voltage to the desired frequency. Since the XCO has very accurate frequency control, that accuracy is transferred to the VCO, achieving a highly accurate frequency output, usually at much higher frequencies than the XCO can achieve alone, and having the capability to be set to a wide range of frequencies by electronically programming the dividers. This reprogramming is usually under software control.

Expanding wireless applications such as cellular telephones have spurred the recent development of phase locked loop synthesizer integrated circuits to provide all the required frequency dividers and the phase detector of a PLL synthesizer in one compact integrated circuit package, with the voltage controlled oscillator and loop filter usually implemented with discrete components or separate modules. In most implementations multiple radio frequency (RF) buffer amplifiers are also employed with the VCO, both to provide isolation of the VCO from disturbing outside influences and to provide a means of controlling the output amplitude of the generated signal. Crystal reference oscillator modules usually referred to as Temperature Compensated Crystal Oscillators (TCXO's) are commonly used. These modules are trimmed in manufacturing to be exactly on frequency, and are usually voltage controllable over a range that is small but still sufficient to steer the TCXO to stay exactly on frequency over the temperature range over which the system must operate.

While this design approach provides sufficient size, power, and cost efficiency for markets such as cellular telephones, there is a large class of short range wireless equipment whose size, power, and cost constraints are much more severe. These applications include automatic identification, keyless entry systems, status reporting, security systems, control systems, simple local area networks, and many other local area wireless data links. To date, even with the advances promoted by the success of the cellular and other wireless markets, the constraints of this very low power market have prevented the use of frequency synthesis in this class of equipment. The specific difficulties encountered in applying frequency synthesis to this very low power market include power consumption, implementation of frequency modulation inside a phase locked loop, dealing with degraded frequency accuracy resulting from the least expensive class of crystals, and general cost and size issues. The unacceptable DC power consumption is the result of power usually consumed in the synthesizer IC, the VCO and RF buffers, and the TCXO. The difficulty of implementing FM results from the fact that the phase locked loop responds to frequency modulation the same way it does to any other source of frequency error, and acts to remove such error. But in the case of deliberate frequency modulation, this correction results in distortion of the desired modulation.

Two other practical implementation difficulties also arise when attempting design of highly efficient FM wireless data systems where the FM is generated within a phase locked loop. First, the VCO tune slope, or the ratio of frequency change per volt, is nonlinear and usually varies significantly over the desired band of operation. Thus a constant modulation voltage applied to the VCO when at different carrier frequencies results in undesired variation in the system frequency deviation over the band of operation. The other problem is a tendency to move the carrier frequency off that desired by the initiation of modulation.

Because of these difficulties in applying synthesized systems to the low power market, the standard technology now applied to meet the severe constraints of the market is based upon Surface Acoustic Wave (SAW) devices. These are basically crystals with the resonant acoustic mode constrained to the surface area of the crystal, which allows the SAW crystal to go to much higher frequency than typical bulk mode crystals. The SAW device is used to stabilize the frequency of a simple oscillator circuit, allowing compact, low power, and low cost generation of the required radio frequency carrier. Amplitude modulation is conveniently applied to an RF buffer stage or directly to the SAW stabilized oscillator. However, such technology has significant performance disadvantages compared to frequency synthesis. These disadvantages include only single channel operation, poor frequency accuracy, and difficulty in using the superior technique of frequency modulation. The difficulty in attaining acceptable frequency modulation performance almost always results in use of amplitude modulation (AM), with subsequent severe multipath fade degradation.

If frequency modulation can be directly applied to a phase locked loop, then a high degree of circuit efficiency can be attained. In seeking this desirable goal there is a long history of attempts to directly modulate PLL synthesizers in radio link and other equipment has resulted. U.S. Pat. No. 3,393, 380 granted to Webb and assigned to the National Aeronautics and Space Administration, PHASE LOCKED PHASE MODULATOR INCLUDING A VOLTAGE CONTROLLED OSCILLATOR, 1968, presents an early example of frequency modulation of a phase locked loop. This simple early form injects the modulation into the phase detector output, which has the disadvantages of limited modulation rate due to the filtering action of the subsequent low pass loop filter, as well as allowing distortion to be introduced by the response of the phase locked loop to the modulation. It did, however, represent an advance on the frequency modulation techniques used at the time. The intended application was space communications. No power consumption reduction techniques are presented, nor any method of preventing the phase locked loop from distorting the desired FM.

U.S. Pat. No. 5,097,230 to Lautzenhiser and assigned to Emhiser Research Limited, PHASE LOCKED LOOP THAT INCLUDES D.C. MODULATION, is typical of a set of patents that allow the highly desirable feature of D.C. modulation in a phase locked loop. This complicated technique and other similar methods are highly applicable and usefull in classes of equipment that are not extremely size, cost, and power limited. For low power wireless such techniques cannot meet the severe constraints on those same parameters.

U.S. Pat. No. 5,493,257 to Chadwick and assigned to Plessy Semiconductor Limited, MODULATOR WITH BIASING CIRCUIT TO MINIMIZE OUTPUT DISTORTION, presents a method for efficient implementation of "mid point" modulation in an FM PLL system. Midpoint modulation may be defined as a method of initiating modulation from the carrier out to the state that defines a logic one or zero, such that initial deviation is one half of the peak to peak deviation. However, the technique presented by Chadwick is limited to A.C. coupling of the desired modulation. U.S. Pat. No. 4,609,886 to Takaki and assigned to Pioneer Electronic Corporation, PLL MODULATION CIRCUIT, presents a method of attaining true D.C. coupling in an FM PLL system, but the method is overly complex and expensive for use in low power wireless.

U.S. Pat. No. 5,379,002, to Jokura and assigned to NEC Corporation, FREQUENCY SYNTHESIZER USING INTERMITTENTLY CONTROLLED PHASE LOCKED LOOP, teaches a fast switching frequency synthesizer circuit employing an intermittently controlled PLL along with a control voltage coarse adjustment circuit. Power savings are claimed in that the lock seek time is minimized. The invention presented by this Jokura patent is specifically intended for rapid channel switching in a Time Division Multiple Access (TDMA) cellular system, and is not optimized for a mode of operation or the minimum power and component count demanded in very low power digital wireless applications.

Accordingly, a need still exists for an apparatus which provides a form of PLL synthesizer based communications equipment for use in very compact, low power, low cost, and minimum component count radio communications equipment.

SUMMARY OF THE INVENTION

The present invention provides an apparatus to satisfy the aforementioned need.

Accordingly, the present invention relates to an apparatus for efficient low power radio communications, comprising transmitting means having frequency synthesizing means and a transmitting antenna that transmits an output signal. The frequency synthesizing means comprises a phase locked loop circuit having open loop and close loop conditions with a voltage controlled oscillator having a VCO output with a variable frequency; a crystal controlled oscillator having a stable frequency with a reference frequency output; and a loop filter/sample and hold circuit that switches the phase lock loop circuit between the open loop and close loop conditions. In the open loop condition the output signal remains stable and substantially on frequency, with a minimum of frequency drift, over a period of time allowing the frequency synthesizing means to be partially powered down to reduce power consumption, and frequency modulation is unimpeded in this open loop condition. The present invention also comprises a receiving means having a receiving antenna, automatic frequency control means and at least one signal source. The receiving means receives the output signal from the transmitting means through the receiving antenna and the automatic frequency control means automatically, by controlling the frequency of the signal source, tunes the receiving means to correct for the frequency drift resulting from the phase locked loop circuit being switched into an open loop condition such that reliable communications are maintained in the presence of the frequency drift.

In another aspect, the present invention relates to an apparatus for efficient low power radio communications, comprising transmitting means having frequency synthesizing means and a transmitting antenna that transmits an output signal. The frequency synthesizing means comprises a phase locked loop circuit having open loop and close loop conditions with a voltage controlled oscillator having a VCO output with a variable frequency; a crystal controlled oscillator having a stable frequency with a reference frequency output; and a loop filter/sample and hold circuit that switches the phase lock loop circuit between the open loop and close loop conditions. In the open loop condition, the output signal remains stable and substantially on frequency, with a minimum of frequency drift, over a period of time, allowing the frequency synthesizing means to be partially powered down to reduce power consumption, and frequency modulation to be unimpeded. The present invention also comprises receiving means having automatic voltage control means and a reference voltage. The receiving means receives the output signal from the transmitting means through receiving antenna and the automatic voltage control means automatically adapts the reference voltage in order to compensate for the frequency drift resulting from phase locked loop being switched into the open loop condition, thus allowing for reliable communications to continue in the presence of the unavoidable frequency drift and error of the transmitting means in the open loop condition.

In yet another aspect, the present invention relates to a transmitting means for efficient low power radio communication, comprising frequency synthesizing means. The frequency synthesizing means comprise a phase locked loop circuit having open loop and close loop conditions with a voltage controlled oscillator having a VCO output of variable frequency, and with an active loop filter/sample and hold circuit having an active loop filter operational amplifier and at least one active loop filter capacitor therewithin. When the phase locked loop circuit is put into the open loop condition, the active loop filter operational amplifier and the active loop filter capacitor store and retain the VCO output at a certain frequency. The presence of the active loop filter operational amplifier reduces inevitable discharge of the active loop filter capacitor, and holds the VCO output substantially on frequency allowing for unimpeded frequency modulation and the partial powering down of the frequency synthesizer means when the phase locked loop circuit is in the open loop condition.

In yet another aspect, the present invention relates to a transmitting means for efficient low power radio communication, where the transmitting means operates with a certain frequency modulated frequency deviation over a certain carrier frequency range. The transmitting means comprises frequency synthesizing means comprising a phase locked loop circuit having open loop and close loop conditions, with a voltage controlled oscillator having a VCO output of variable frequency, and a passive loop filter/sample and hold circuit having at least one loop filter capacitor and a buffer/linearizer therein. The buffer/linearizer is based on at least one operational amplifier, buffer resistor, and buffer semiconductor device. The passive loop filter/sample and hold circuit switches the phase lock loop circuit between the open loop and the close loop conditions such that the VCO output remains stable and substantially on frequency in the open loop condition, with a minimum of frequency drift over a period of time. The buffer/linearizer reduces frequency drift in the open loop condition by reducing discharge from the loop filter capacitor, and also reduces non-linearity in the voltage controlled oscillator by providing a substantially correcting non-linearity of its own thereby maintaining more constant frequency modulated frequency deviation over the carrier frequency range over which the transmitting means operates.

In yet another aspect, the present invention relates to a transmitting means for efficient low power radio communication, the transmitting means operates with a certain frequency modulated frequency deviation over a certain carrier frequency range, comprising a step linearizer having at least two selectable voltage divider ratios. A data signal is modulated by the step linearizer. A frequency synthesizing means incorporates the step linearizer and comprises a phase locked loop circuit, having open and close loop conditions, with a voltage controlled oscillator having a VCO output of variable frequency, and a loop filter/sample and hold circuit. The loop filter/sample and hold circuit switches the phase lock loop circuit between the open loop and close loop conditions, such that the VCO output remains stable and substantially on frequency when the phase locked loop circuit is in the open loop condition, with a minimum of frequency drift over a period of time. Any non-linearity of the voltage controlled oscillator relative to the modulation of the data signal by the step linearizer is reduced by the application of the step linearizer voltage divider ratio most appropriate to the particular frequency in use, thereby maintaining more constant frequency modulated frequency deviation over the carrier frequency range over which the transmitting means operates.

In yet another aspect, the present invention relates to a transmitting means for efficient low power radio communication. The transmitting means operates with a certain frequency modulated frequency deviation over a certain carrier frequency range and comprises DC cancellation mid-point modulation means utilizing a DC compensating signal and a data signal. The DC compensating signal has a non-modulation state and a modulation state such that the DC compensating signal changes from the non-modulation state to the modulation state upon commencement of modulation and remains in the modulation state so long as modulation continues. The data signal has a DC voltage content which swings between end points around a nominal mid-point. The data signal state prior to modulation commencing is in the opposite state from the DC compensating signal. Resistive summing circuit sums the DC compensating signal and the data signal such that the component in the sum due to the DC compensating signal effectively cancels the change in the DC content of the component in the sum due to initiation of modulation by the data signal, resulting in a DC cancellation mid-point modulation output whereby the commencement of data modulation begins from the nominal mid-point between the end points of the DC voltage content swing of the data signal such that there is no change in the average DC level of the DC cancellation mid-point modulation output in the modulation and non-modulation states. Frequency synthesizing means incorporates the DC cancellation mid-point modulation means and further comprises a phase locked loop circuit, having open and close loop conditions, with a voltage controlled oscillator having an VCO output of variable frequency, and a loop filter/sample and hold circuit. The loop filter/sample and hold circuit switches the phase lock loop circuit between the open loop and close loop conditions. The output signal remains stable and substantially on frequency when the phase locked loop circuit is in the open loop condition, with a minimum of frequency drift over a period of time. The DC cancellation mid-point modulation means causes the frequency deviation to vary approximately equally around the desired carrier frequency over which the transmitting means may operate, and to do so from the moment modulation commences.

In yet another aspect, the present invention relates to a transmitting means for efficient low power radio communication. The transmitting means operates with a certain frequency modulated frequency deviation over a certain carrier frequency range. The transmitting means comprises frequency synthesizing means incorporating DC elimination mid-point modulation means having a DC elimination mid-point modulation output and utilizing a tri state buffer having a tri state buffer output and both high impedance and normal output modes, and first and second bias resistors forming a resistive voltage divider biasing network on the tri state buffer output such that when the tri state buffer is in the high impedance output mode the voltage divider biasing network sets a DC voltage on the tri state buffer output. A data signal having a DC voltage content which swings between end points around a nominal mid-point is modulated by the DC elimination mid-point modulation means whereby the tri state buffer high impedance is applied prior to the initiation of modulation and whereby the resistive voltage divider biasing network sets a DC bias level representative of the expected DC content of the data signal, and whereby the tri state buffer is switched to its normal output mode the moment modulation commences such that modulation begins from the set DC bias level at the nominal mid-point of the DC voltage content swing of the data signal such that there is no change in the average DC level of the DC elimination mid-point modulation output in the non-modulation and modulation states. The frequency synthesizing means further comprises a phase locked loop circuit, having open and close loop conditions, with a voltage controlled oscillator having a VCO output of variable frequency, and a loop filter/sample and hold circuit. The loop filter/sample and hold circuit switches the phase lock loop circuit between the open loop and close loop conditions. The output signal remains stable and substantially on frequency when the phase locked loop circuit is in the open loop condition, with a minimum of frequency drift over a period of time. The DC elimination mid-point modulation means provides modulation that deviates approximately equally on both sides of the carrier frequency over which the transmitting means operates, and does so from the moment modulation commences.

BRIEF DESCRIPTION OF THE DRAWINGS

Further features of the present invention will become apparent to those skilled in the art to which the present invention relates from reading the following specification with reference to the accompanying drawings in which.

DESCRIPTION OF THE PREFERRED EMBODIMENT

Figure 1:
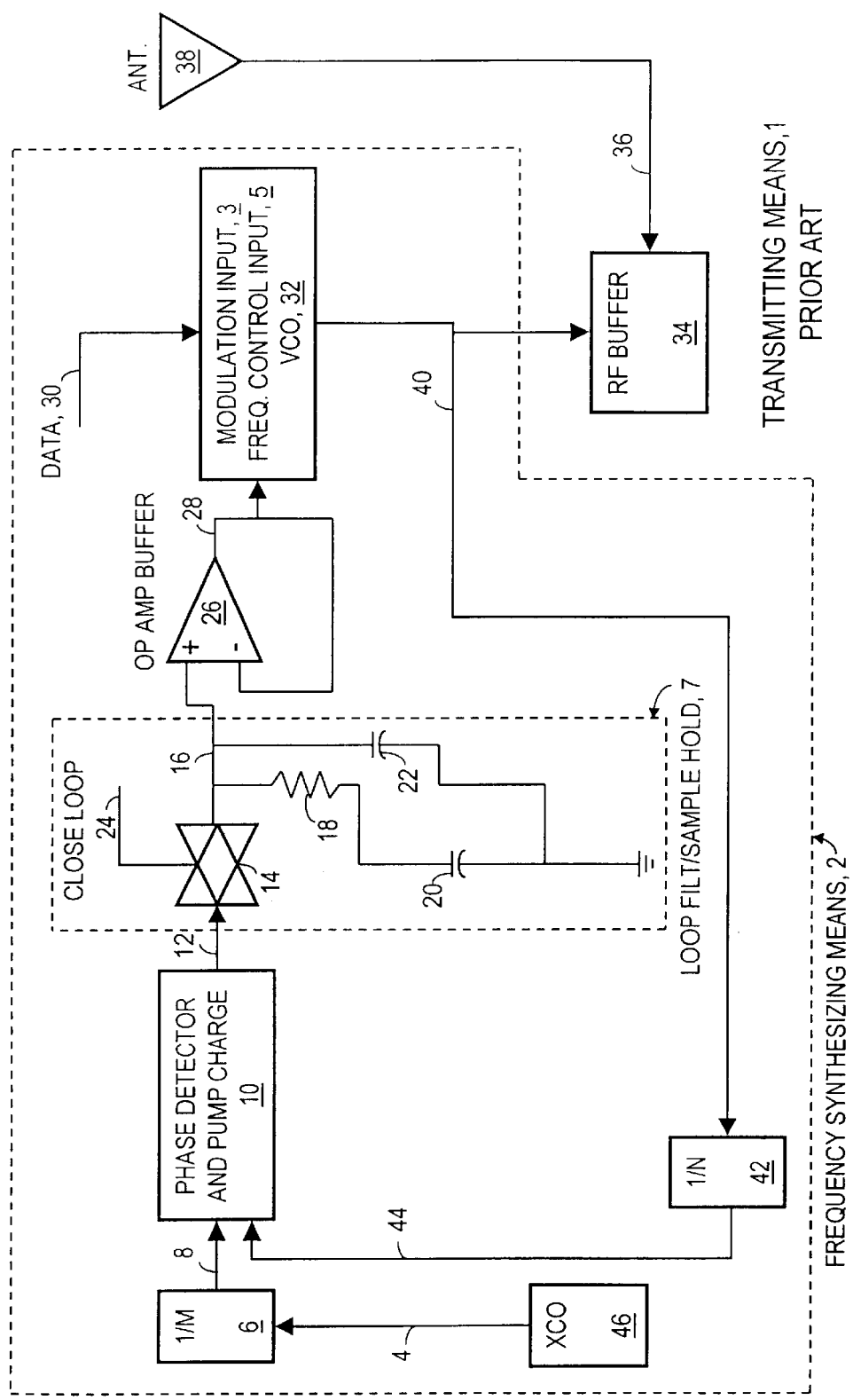
FIG. 1 is a block diagram and schematic of prior art showing a frequency synthesizing means comprising a phase locked loop circuit having passive loop filter/sample and hold circuit shown in schematic form.

Referring now to drawing FIG. 1 there is shown a transmitting means 1, which is known in the prior art. Detailed operation of the prior art will be described to provide a basis for understanding overall system operation and the preferred embodiments of the invention. The transmitting means 1 has a frequency synthesizing means 2 and operates with a certain frequency modulated frequency deviation over a certain carrier frequency range. The frequency synthesizing means 2 comprises a phase locked loop (PLL) circuit having open loop and close loop conditions with a voltage controlled oscillator (VCO) 32; a divide-by-N block 42; a divide-by-M block 6; crystal controlled oscillator (XCO) 46; a phase detector/charge pump 10; and a passive loop filter/sample and hold circuit 7 having loop filter resistor 18, at least one loop filter capacitor, shown in FIG. 1 as first and second loop filter capacitors 20 and 22, and analog switch 14.

In normal operation, a PLL circuit based frequency synthesizing means 2 is a negative feedback control loop with the phase of the VCO output 40 as the controlled variable. Since frequency is the mathematical derivative of phase with respect to time, by controlling the phase of the VCO 32 the frequency is also controlled. The VCO 32 changes frequency in response to the VCO control voltage 28 which is inputted to the VCO 32 at frequency control input 5. The VCO output 40 is inputted to the divide-by-N block 42, which divides the frequency of the VCO output 40 by an integer N and presents the quotient as the N block output 44. The XCO 46 produces a reference frequency output 4 which is inputted to the divide-by-M block 6. The divide-by-M block 6 divides the frequency of the reference frequency output 4 by an integer M and presents the quotient as a M block output 8. The N block output 44 and the M block output 8 are inputted to the phase detector/charge pump 10. The phase detector/charge pump 10 compares the phases of the M block output 8 and the N block output 44 and provides a phase detector output 12 proportional to the phase difference between them. In modern frequency synthesizers the phase detector output 12 is a constant current over a time period proportional to the phase error during each sample period, which is in pulse width modulated form. The sample period is determined by the period of M block output 8. The phase detector output 12 is connected to the passive loop filter/sample and hold circuit 7 consisting of analog switch 14, loop filter resistor 18, and loop filter capacitors 20 and 22. Close loop signal 24 actuates analog switch 14 which puts the PLL circuit in the close loop condition. The passive loop filter/sample and hold circuit 7 converts the current pulses provided by phase detector/charge pump 10 into a low noise loop filter output voltage 16 which is buffered by unity gain buffer based on operational amplifier 26 and inputted to the VCO 32 as the VCO control voltage 28.

The VCO control voltage 28 is driven by the negative feedback action of the system to whatever voltage is required to achieve a VCO output frequency equal to N(Fref)/M, where Fref is the frequency of the reference frequency output 4, N is the integer used in the divide-by-N block 42 and M is the integer used in the divide-by-M block 6. When this condition is achieved, the phases of the N block output 44 and the M block output 8 are substantially equal, the phase detector output 12 is substantially zero, and the VCO control voltage 28 undergoes no further changes. Once this VCO control voltage 28 is established, the frequency synthesizing means 2 is said to be "locked" on the desired carrier frequency. The frequency to which the VCO 32 is driven can be changed by reprogramming the values of M and N. Once the desired carrier frequency is locked on, the PLL circuit then merely holds the VCO control voltage 28 to the necessary value. This maintenance action requires a substantial amount of power, due to the power consumption of the divide-by-N block 42, the divide-by-M block 6, and the phase detector/charge pump 10. The VCO output 40 is amplified by RF buffer 34 that generates output signal 36 which drives transmitting antenna 38.

Once the frequency synthesizing means 2 is locked at the desired carrier frequency, it is desired to frequency modulate the output frequency of VCO 32 by application of data signal 30 Frequency modulation is an excellent form of modulation to use in the hostile radio link environment, especially for systems that allow movement and suffer from multipath fade. Direct modulation of a frequency synthesizer would provide for a very circuit efficient and low cost method of generating such modulation, and such highly efficient methods are commercial requirements of the low power wireless market. However, in the locked state the frequency synthesizer responds to the frequency modulation so induced as an error that it will attempt to servo out. If the data signal 30 contains noticeable frequency components within the loop bandwidth of the PLL circuit, then this control action will result in distortion of the desired frequency modulation and the communication link will fail. This problem may be defeated by a process referred to herein as "opening the loop" which puts the PLL circuit into an open loop condition. This is accomplished by first seeking lock, then opening analog switch 14 to trap the necessary loop filter output voltage 16 on first and second loop filter capacitors 20 and 22 with no path for charge to drain away. Another way of opening the loop made available in some state of the art synthesizer IC's is to program the phase detector output 12 to a high impedance condition. Either the analog switch 14 as depicted in FIG. 1 or the capability to implement an off state high impedance mode in the phase detector output 12 may be used in implementing the passive loop filter/sample and hold circuit 7 used to put the PLL circuit into an open loop condition. In the open loop condition the passive loop filter/sample hold circuit 7 is in sample and hold mode, and the loop filter output voltage 16 is held constant, which keeps VCO control voltage 28 constant, and thus holding VCO 32 output frequency constant. In this mode data signal 30 which is inputted to VCO 32 at modulation input 3 is applied to modulate the frequency of VCO 32 around the carrier frequency, and since the PLL circuit is in the open loop condition, the frequency synthesizing means 2 will not respond to the modulation as error. A further benefit of this mode is that since divide-by-N block 42, divide-by-M block 6, and phase detector/charge pump 10 are not in use, they may be powered down to conserve power. Some modern synthesizer integrated circuits, such as the Fujitsu MB 1513, offer a power down mode that allows conveniently powering down these sections of the synthesizer while allowing the registers setting the divide factors M and N to remain programmed.

In the open loop condition the frequency synthesizing means 2 will eventually drift out of the receiver bandwidth, limiting the time the loop may be held open, unless further measures are taken. Practical open loop times are in the range of milliseconds to tens of milliseconds without the unity gain buffer based on an operational amplifier 26, but may sometimes be extended to hundreds of milliseconds with the operational amplifier 26 as shown. If only a brief burst of transmit data is required, these time periods may be acceptable for a given application. If the time between transmissions is relatively long compared to the XCO 46 start up time, then XCO 46 may also be powered down following lock and opening of the loop.

The basic PLL and open/close loop operation of the transmitting means 1 shown in FIG. 1 is applicable to the preferred embodiments of the present invention as described below and shown in the other drawings and therefore will not be repeated when describing the other preferred embodiments except when a particular preferred embodiment involves a change to the basic operation.

Figure 2:
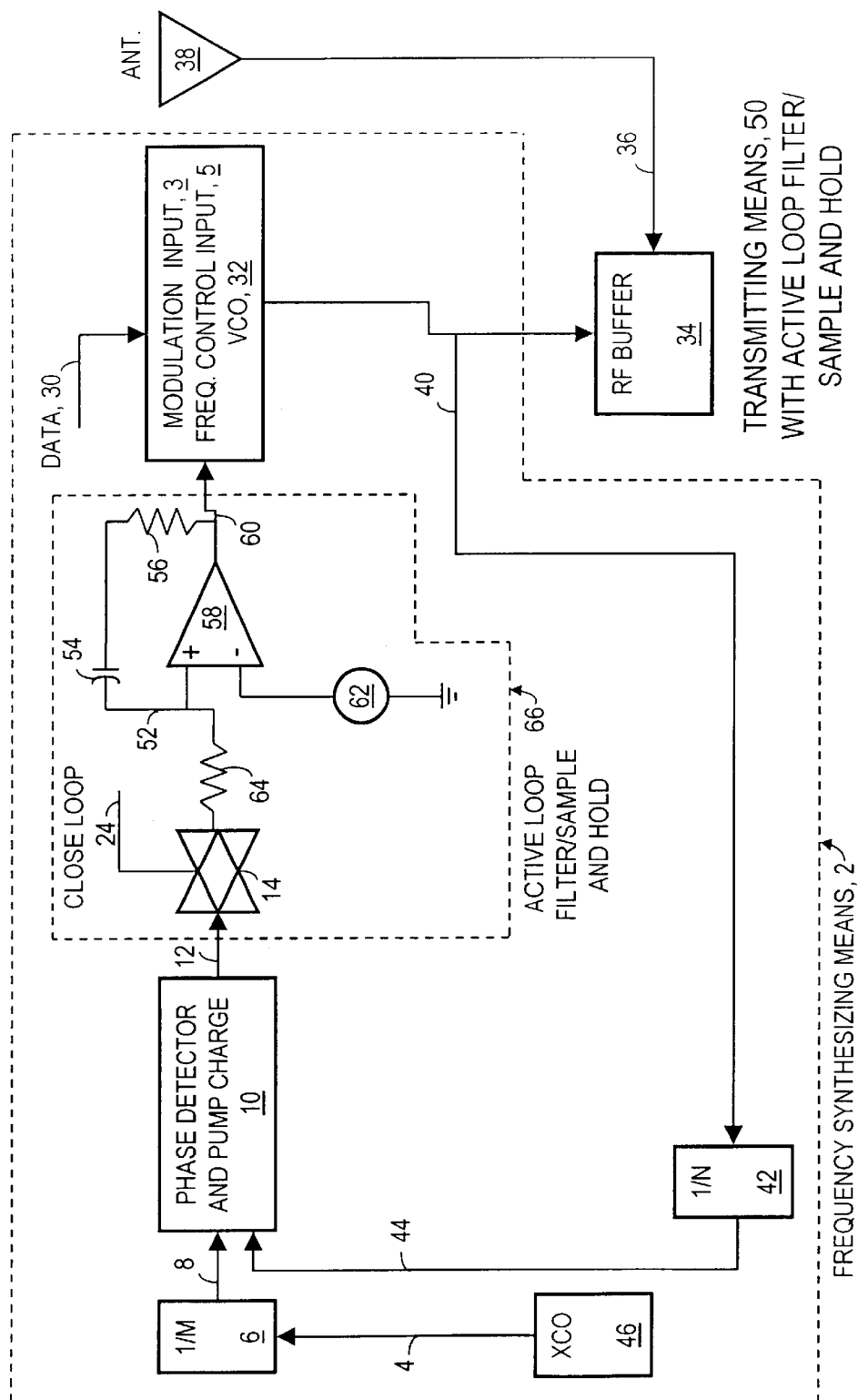
FIG. 2 is a block diagram of a frequency synthesizing means frequency synthesizing means comprising a phase locked loop circuit having an active loop filter/sample and hold circuit shown in schematic form.

Referring now to FIG. 2 there is shown a block diagram of transmitting means 50. Operation is similar to that of FIG. 1. The passive loop filter/sample and hold circuit 7 and operational amplifier 26 based buffer (not shown in FIG. 2) are replaced with an active loop filter/sample and hold circuit 66 that provides significant performance improvement. The phase detector output 12 in the phase detector/charge pump 10, although normally current output devices, will emulate voltage output devices that saturate at ground and at the charge pump power supply level if loop filter input resistor 64 is of sufficient magnitude that current drive into loop filter input resistor 64 is less than normal charge pump output, so that the charge pump outputs saturate and go to the voltage rails, usually ground and a positive voltage in the 3 to 5 volt range. The voltage reference 62 provides an artificial ground for active loop filter operational amplifier 58. The feedback action of the loop will force the voltage on operational amplifier negative input 52 to match that of voltage reference 62. When the PLL circuit has settled and VCO 32 is on the desired frequency, the PLL circuit may be put into the open loop condition by using analog switch 14 or switching off the charge pumps in phase detector/charge pump 10, trapping the control voltage on the active loop filter operational amplifier output 60. The active loop filter operational amplifier output 60 provides any leakage current into VCO control input (also 60), which is held substantially constant due to trapped charge on active loop filter capacitor 54. Loop filter resistor 56 is a standard design feature in this type of active loop filter, and reduces phase shift through the filter in the critical region around loop bandwidth in order to maintain loop stability.

Loop filter input resistor 64 allows the effective charge pump current to be set to much smaller, but still well controlled, values than available from typical synthesizer IC charge pump outputs. The IC charge pump outputs of commercial IC's vary from 250 uA to 10 mA. In this embodiment, the present invention allows charge pump outputs over that same range, and also any lower amount down to less than 1 uA. Much lower loop bandwidths can thus be achieved with practical component values in the present invention. Similar loop bandwidths can also be attained with smaller active loop filter capacitors 54, which has the important practical advantage of allowing for sufficient capacitance to be provided for the desired bandwidth using very low leakage dielectric capacitors in the loop filter in an acceptably small physical form. These low leakage capacitors can significantly reduce sample and hold drift over a given time period, thus increasing the allowable open loop transmit time as compared to the passive loop/sample and hold circuit.

Figure 3:
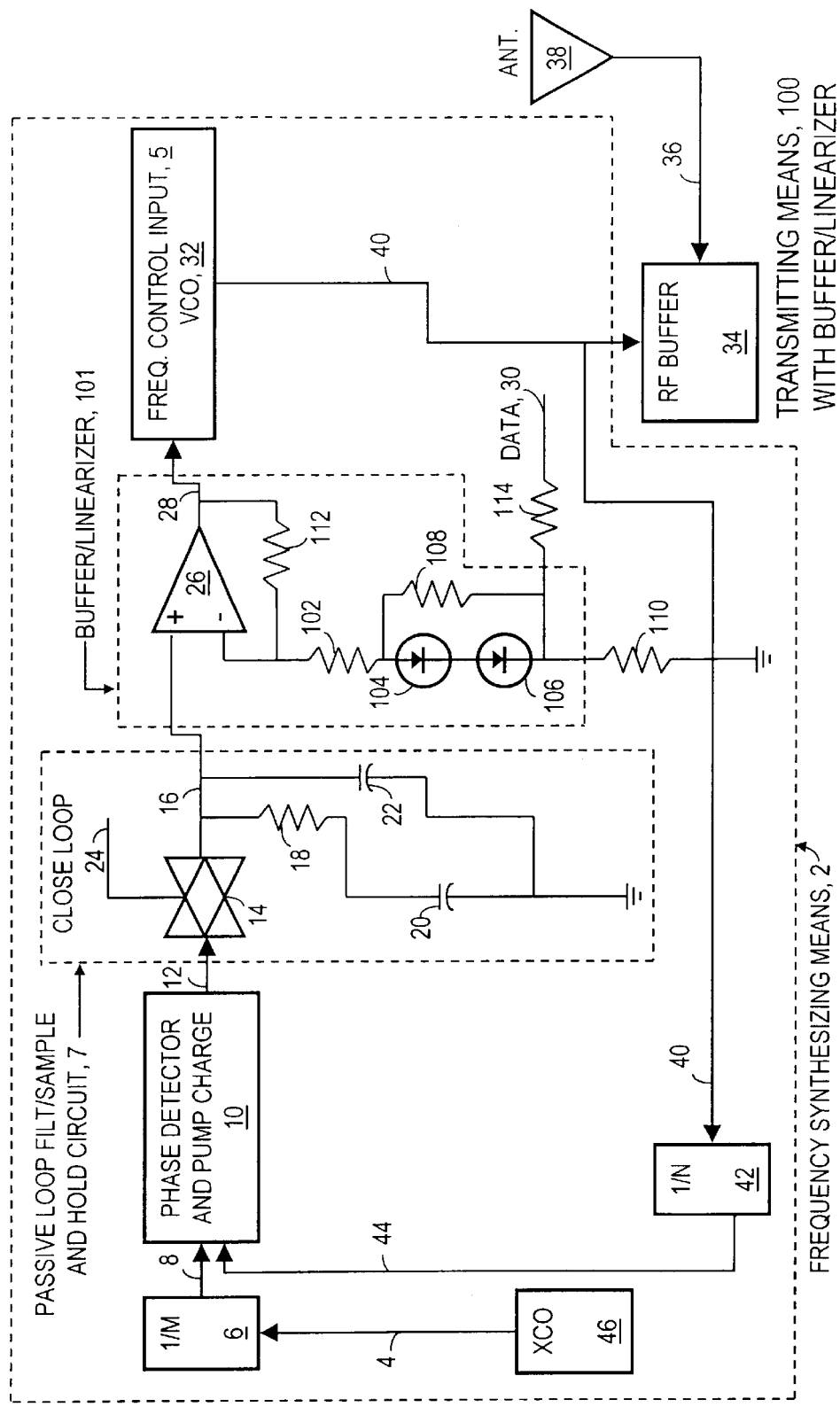
FIG. 3 is a block diagram of a frequency synthesizing means comprising a phase locked loop circuit having a passive loop filter/sample and hold circuit and a buffer/linearizer shown in schematic form.

Referring now to FIG. 3 there is shown a block diagram of transmitting means 100. The transmitting means 100 has a buffer/linearizer 101 that reduces non-linearity in the VCO 32 by providing a substantially correcting non-linearity of its own thereby maintaining more constant frequency modulated frequency deviation over the carrier frequency range over which the transmitting means 100 operates relative to both Data signal 30 and loop filter output voltage 16, while maintaining the desired buffering function that decreases open loop frequency drift. VCO 32 typically possesses a positive frequency versus control voltage characteristic where frequency increases as VCO control voltage 28 increases, though with decreasing slope whereby the frequency change per unit of voltage is less at higher frequencies and control voltages. Buffer/linearizer 101 consisting of operational amplifier 26, first, second and third buffer/linearizer resistors 102, 108, and 112, respectively, and first and second buffer/linearizer semiconductor devices, shown in FIG. 3 as diodes 104 and 106, respectively, operates as a non inverting buffer of gain unity or greater relative to loop filter output voltage 16 and with inverting gain over a wide range of possible values relative to data signal 30. It is understood that transistors may be used in place of the first and second buffer/linearizer diodes 104, 106. First and second voltage divider resistors 110 and 114 provide a voltage divider to set the frequency deviation achieved to a desired value. Second voltage divider resistor 110 is typically very small compared to first, second and third buffer/linearizer resistors 102, 108 and 112, and has little impact on linearizer action. Standard circuit analysis will show that the VCO control voltage 28 is a sum of loop filter output voltage 16 multiplied by non-inverting gain and Data signal 30 multiplied by inverting gain. At lower control voltages on loop filter output voltage 16 (lower end of tune range), gain of the buffer/linearizer 101 relative to both inverting and non-inverting inputs is less because first and second buffer/linearizer diodes 104 and 106 are either off or only slightly conducting, while at higher control voltages they are significantly conducting, have significantly reduced effective small signal impedance, and thus cause greater gain. This greater gain counteracts the VCO 32 having lesser gain at these higher control voltages, leading to a more stable gain over frequency relative to both inverting (modulation) and non-inverting (frequency control) inputs. In the case where the first and second buffer/linearizer diodes 104, 106 are completely off then second buffer/linearizer resistor 108 still permits modulation to be passed through the circuit. There are not enough degrees of freedom in this lower parts count design to allow simultaneous optimization relative to both inverting and non-inverting inputs, but by proper design the non-linearity relative to one input can be very significantly improved and a worthwhile improvement maintained relative to the other. The capability of this method to simultaneously buffer the passive loop filter/sample hold circuit 7 for decreased open loop drift while also linearizing the VCO 32 is of significant practical importance in low power wireless product design.

Figure 4:
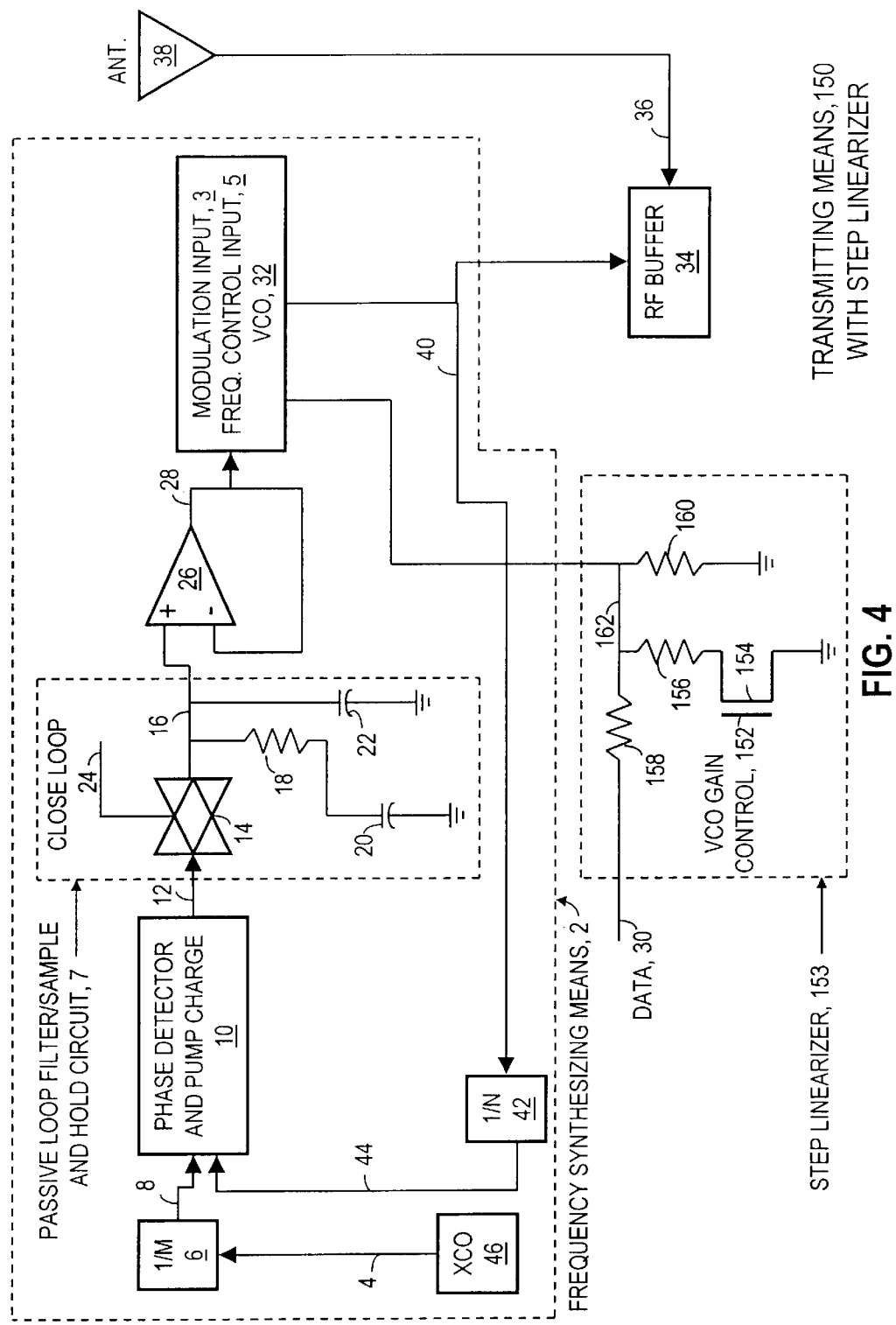
FIG. 4 is a block diagram of a frequency synthesizing means comprising a phase locked loop circuit having a passive loop filter/sample and hold circuit and a step linearizer shown in schematic form.

Referring now to FIG. 4 there is shown a block diagram of transmitting means 150. Transmitting means 150 contains a frequency synthesizing means 2 and a step linearizer 153. The step linearizer 153 has an FET device 154 and step linearizer resistors, shown as 156, 158, and 160, which allow the step linearizer 153 to have-at least two selectable voltage divider ratios. Data signal 30 is inputted to the step linearizer 153 and is modulated by the step linearizer 153 utilizing one of the voltage divider ratios depending on whether FET device 154 is on or off as controlled by VCO Gain Control signal 152. The objective is to scale data modulation output 162 as a function of carrier frequency, typically providing greater signal on data modulation output 162 for the higher end of the tune range where VCO 32 gain is less. In this embodiment, in addition to the VCO control voltage 28 being inputted to the VCO 32, the data modulation output 162 is also inputted to the VCO 32. This is most advantageously accomplished by accessing both sides of a frequency tuning varactor (voltage variable capacitor), (not shown in FIG. 4) in the VCO 32. Any non-linearity of the VCO 32 relative to the modulation of data signal 30 by the step linearizer 153 is reduced by the appropriate choice of selectable voltage divider ratio applied to the data signal 30 in the step linearizer 153 thereby maintaining more constant frequency modulated frequency deviation over the carrier frequency range over which the transmitting means operates. The number of step linearizer resistors and transistors, 156 and 154, respectively, can be increased for improved performance.

This embodiment of the present invention is appropriate for use in the most cost sensitive class of applications, and provides effective linearization for very small circuit area. FET device 154 can be eliminated if the transmitting means 150 is controlled by a microcontroller that possesses a high impedance or float state as an optional output form on its control output pins (not shown on FIG. 4). This embodiment of the present invention can, of course, be used with the active loop filter/sample and hold circuit 66 of FIG. 2 also.

Figure 5:
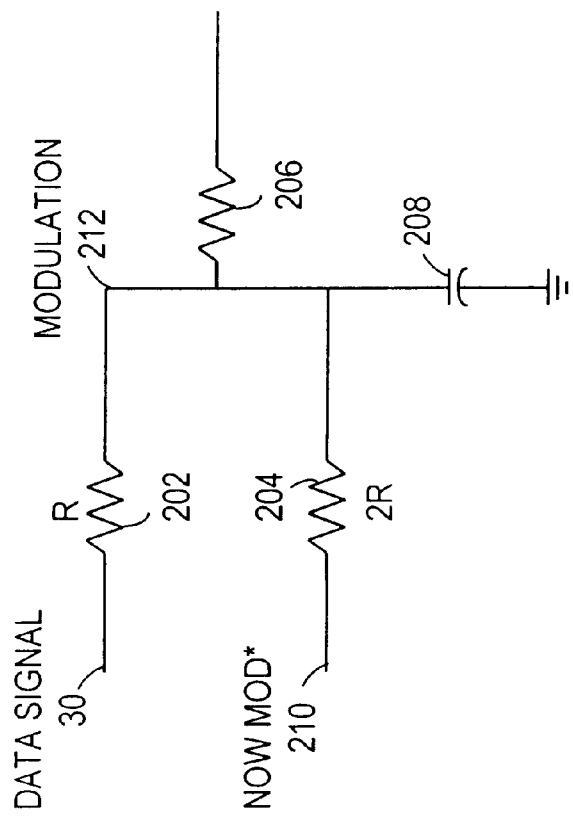
FIG. 5 is a schematic of a DC cancellation mid-point modulation means.

Referring now to FIG. 5 there is shown DC cancellation mid-point modulating means 200 which can be incorporated into frequency synthesizing means 2 (not shown in FIG. 5). DC cancellation mid-point modulation means 200 causes the frequency deviation of the frequency modulation to vary approximately equally around the desired carrier frequency over which the transmitting means (not shown in FIG. 5) may operate. DC cancellation mid point modulation is highly desirable for modulation when the PLL circuit is in the close loop condition and nearly essential in the open loop condition because of the need to modulate the carrier frequency equally on both sides of the nominal or mid channel. With single supply logic levels care must be taken to provide this form of modulation, and within the constraints of low power wireless the circuitry provided to accomplish this mission must do so extremely efficiently. DC cancellation mid point modulation means 200 utilizes a DC compensating signal 210 named NowMod* (low for now modulating) with the data signal 30. The DC compensating signal 210 has a modulation and a non-modulation state. The DC compensating signal 210 changes from the non-modulation state to the modulation state upon commencement of modulation and remains in the modulation state so long as modulation continues. The data signal 30 has a DC voltage content which swings between end points around a nominal mid-point. A resistive summing circuit is used to sum the data signal 30 with the DC compensating signal 210. The DC compensating signal 210 cancels the change in the DC content of the component in the sum due to initiation of modulation by the data signal 30 resulting in a DC cancellation mid-point modulation output 212. Because of this, the commencement of data modulation begins from the nominal mid-point between the end points of the DC voltage content swing in DC cancellation mid-point modulation output 212 induced by data signal 30. Given that data signal 30 and DC compensating signal 210 are defined at the same logic level, the DC compensating resistor 204 through which DC compensating signal 210 is applied should be twice value of the data resistor 202 through which data signal 30 is applied. The result is that the average DC level in DC cancellation mid-point modulation output 212 following initiation of modulation is the same as the DC level prior to modulation, thus not pulling the average frequency of the VCO away from the desired carrier frequency. There is no change in the average DC level of the DC cancellation mid-point modulation output 212 in the modulation and nonmodulation states.

Figure 6:
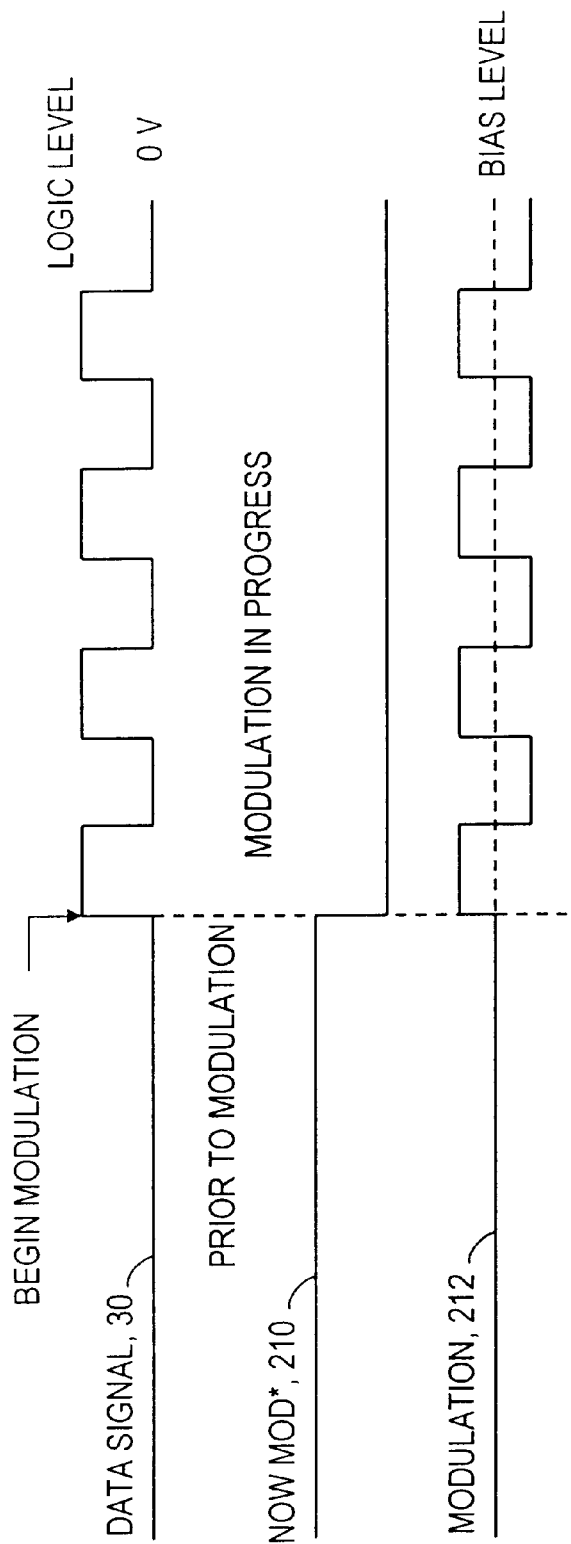
FIG. 6 is a graph of comparative waveforms of data signal, DC compensating signal and DC cancellation mid-point modulation output of the DC cancellation mid-point modulation means shown in FIG. 5.

Referring now to FIG. 6, there is shown comparative waveforms of data signal 30, DC compensating signal 210 and DC cancellation mid-point modulation output 212. Before modulation commences the DC compensating signal 210 is in its non-modulation state which is opposite to the data signal 30 state. Upon modulation the DC compensating signal 210 changes to its modulation state and remains there so long as modulation continues. Data signal 30 changes state only if the first transmitted bit so requires that change to represent it. During modulation the voltage on DC cancellation mid-point modulation output 212 swings equally around the value it maintained prior to modulation, provided that DC cancellation mid-point modulation output 212 is not loaded, or that loading is properly taken into account in value selection for data resistor 202, DC compensating resistor 204, and DC compensated mid-point modulation output resistor 206 (See FIG. 5). If data signal 30 remains constant when modulation commences, then the change in DC compensating signal 210 shifts the carrier half the nominal peak to peak frequency deviation, or from the carrier to the mark or space state. If data signal 30 changes state also, it applies exactly twice the influence of DC compensating signal 210 and shifts the carrier to the opposite state. The shift of DC compensating signal 210 is exactly half that of data signal 30 in order to cancel the expected 50% duty cycle of data signal 30. Another way of expressing this is to say that DC compensating signal 210 moves the signal frequency from the centered carrier to the mark or space state, and data signal 30 then either leaves it there or moves it to the other state as required.

Figure 7:
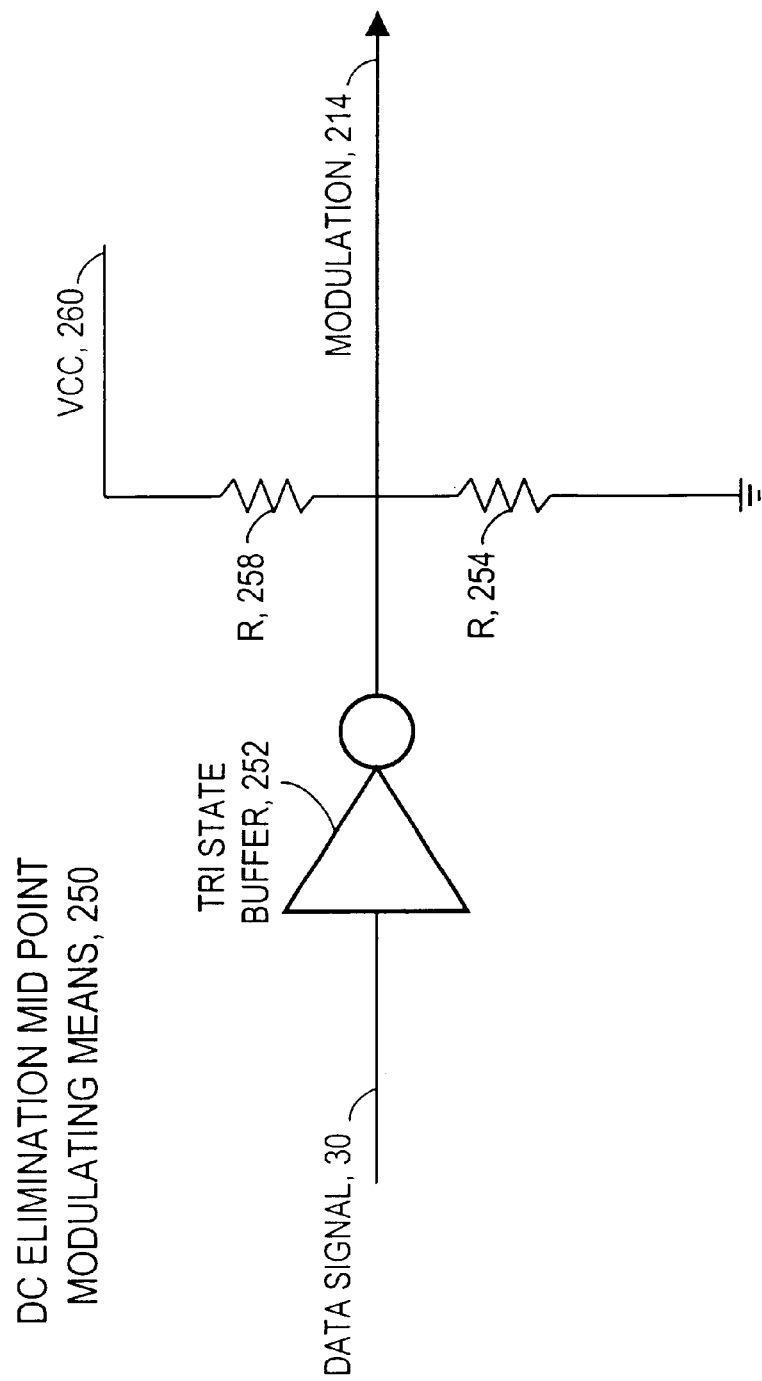
FIG. 7 is a schematic of a DC elimination mid-point modulation means.

Referring now to FIG. 7 there is shown DC elimination mid-point modulating means 250 incorporated into the frequency synthesizing means 2 (not shown in FIG. 7) of the transmitting means (not shown in FIG. 7). DC elimination mid point modulating means 250 utilizes a tri state buffer 252 to implement midpoint modulation of a data signal 30 that can be logic low, logic high, or high impedance float. The tri state buffer 252 has tri state buffer output 214 and has both normal and high impedance output modes. The DC elimination mid point modulating means 250 eliminates variation in the DC voltage content in the data signal 30 between the non-modulation and modulation states inherent in single supply logic levels. Before modulation commences, tri state buffer 252 is in the high impedance state with first and second bias resistors 254 and 258 forming a resistive voltage divider biasing network on the tri state buffer output 214 such that the resistive voltage divider biasing network sets a DC voltage on the tri state buffer output 214. This sets a DC bias level representative of the expected DC content of the data signal 30. The tri state buffer 252 is switched to its normal output mode the moment modulation commences. The initiation of modulation, then, does not tend to pull the average output frequency away from the desired carrier frequency, but allows the tri state buffer 252 to provide modulation that deviates approximately equally on both sides of the desired carrier frequency over which the transmitting means operates and provides such equally deviating modulation from the moment modulation commences. Therefore, there is no change in the average DC level in the DC elimination mid-point modulation output 262 in the modulation and non-modulation states.

Figure 8:
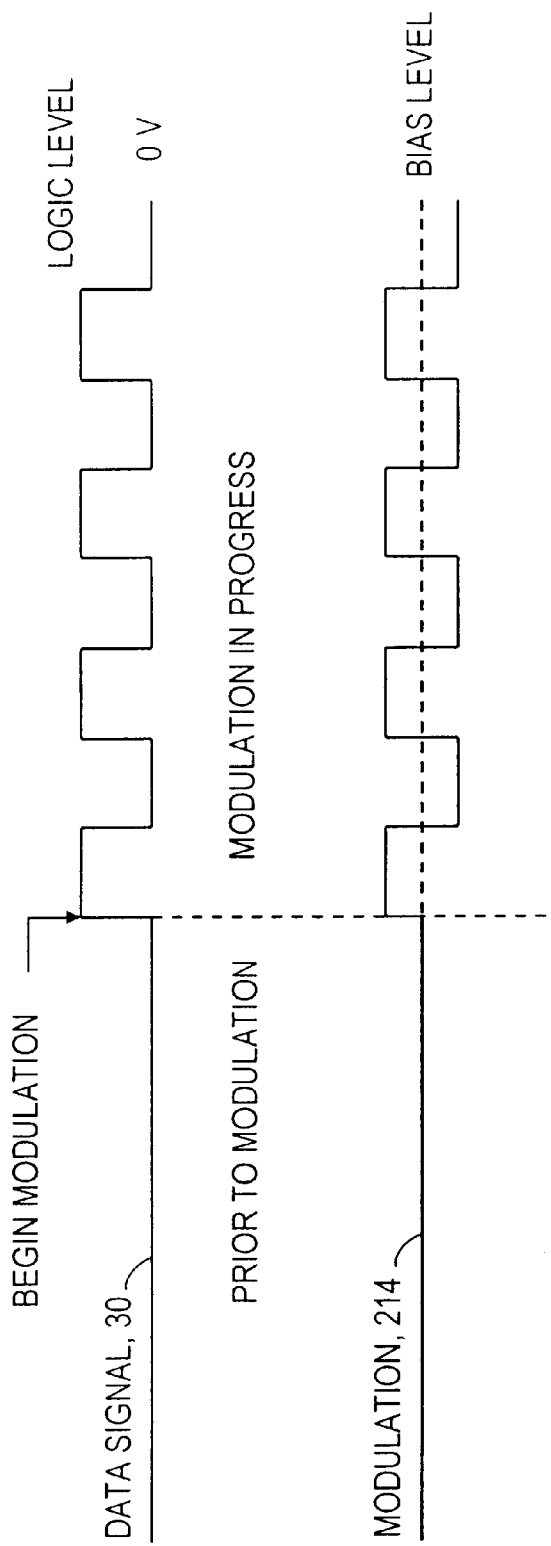
FIG. 8 is a graph of comparative wave forms of data signal and DC elimination mid-point modulation output of the DC elimination mid-point modulation means shown in FIG. 7.

Referring now to FIG. 8, there is shown comparative waveforms of data signal 30 and DC elimination mid-point modulation output 262. At the moment modulation commences tri state buffer 252 is switched into normal output mode and tri state buffer output 214 goes low or high as required. Because DC elimination mid-point modulation output 262 begins from the applied DC bias level at the nominal mid-point of the voltage swing of the data signal 30 and the loop has been locked to the desired carrier frequency with it in that state, the DC elimination mid-point modulating means 250 provides inherent mid point modulation. U.S. Pat. No. 5,493,257 to Chadwick and assigned to Plessy Semiconductor Limited, MODULATOR WITH BIASING CIRCUIT TO MINIMIZE OUTPUT DISTORTION, presents a similar method for efficient implementation of mid point modulation in an FM PLL system. However, the technique shown there is limited to AC coupling of the desired modulation.

Figure 9:
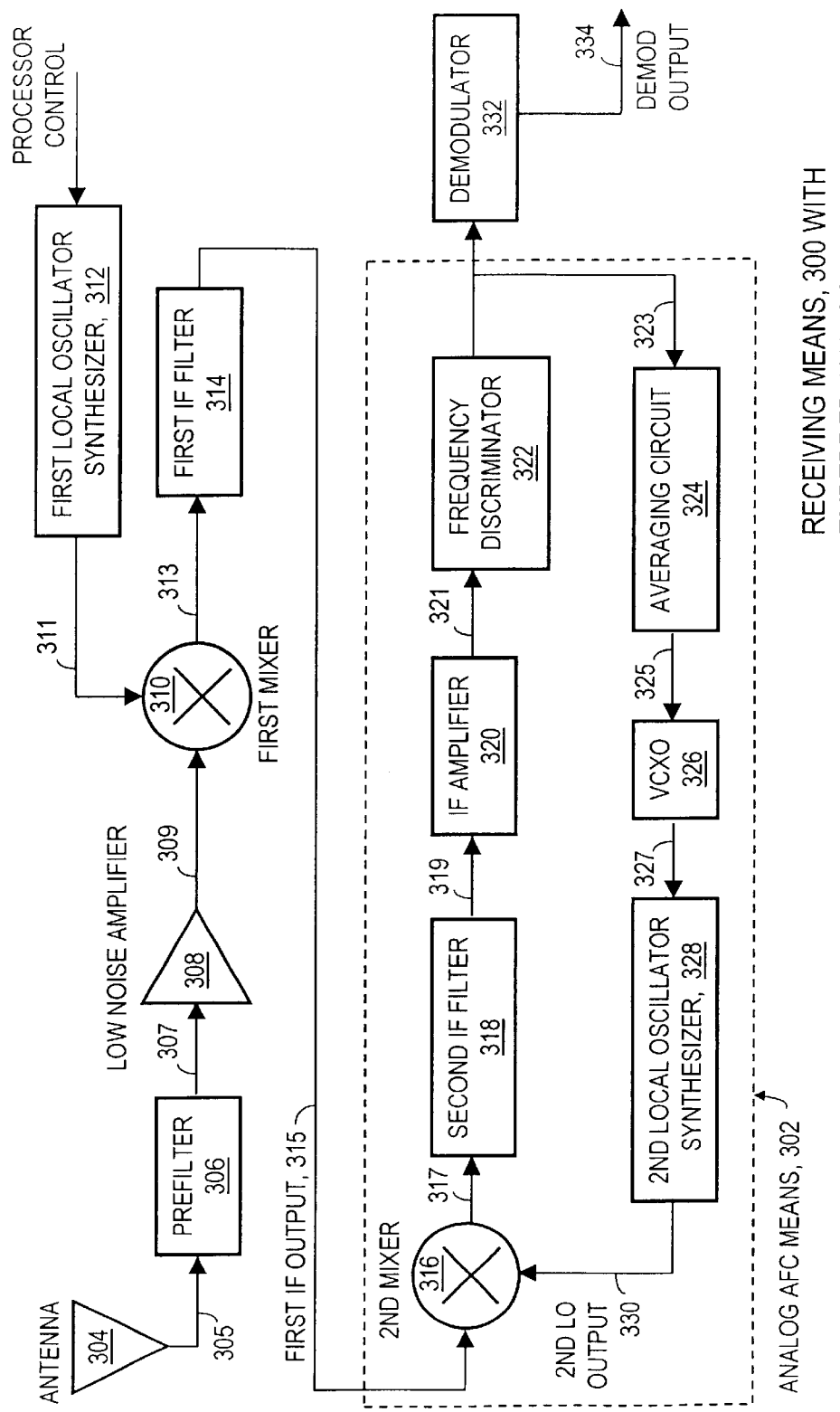
FIG. 9 is a block diagram of a receiving means with analog automatic frequency control means.

Referring now to FIG. 9 there is shown a block diagram of receiving means 300 that can considerably extend open loop time in the transmitter. In this embodiment of the present invention the receiver has the capability to track the drift and error in the transmitter frequency, in the presence of frequency modulation in the transmitter, and keep the signal tuned in. Tracking drift allows reliable operation with a very compact, low cost, and low power transmitter, such as that represented by FIG. 1. The ability to deal with reasonable frequency error allows for low cost crystals, an important practical consideration. Both goals are achieved with implementation of a specialized automatic frequency control system in the receiver. To meet the requirements of the target market the circuit implementation must be highly efficient.

The receiving means 300 has an analog automatic frequency control (AFC) means 302 and is shown as a typical double conversion receiver, such as might be used for the 902 to 928 MHz ISM band, although a single conversion receiver may also be used, and at higher frequency a triple conversion might be appropriate. Analog AFC means 302 is a negative feedback control circuit consisting of second mixer 316, second IF filter 318, IF amplifier 320, frequency discriminator 322, averaging circuit 324, and at least one signal source. In FIG. 9 two signal sources are shown, voltage controlled crystal oscillator (VCXO) 326 and second LO synthesizer 328.

The receiving means 300 receives the receiver input signal 305 through the receiving antenna 304. The receiver input signal 305 is passed through bandpass prefilter 306 that suppresses any out of band received signals resulting in prefilter output 307 which is inputted and drives the input of low noise amplifier (LNA) 308. LNA output 309 is inputted and drives first mixer 310. Here the incoming frequency of LNA output 309 is mixed with the first LO output 311 of first local oscillator (LO) synthesizer 312 to be down converted to the first intermediate frequency (IF) available at first mixer 310 output 313. The difference between the frequency of the receiver input signal 305 and the first LO output 311 is the first IF frequency. The purpose of this frequency conversion process is to allow filtering at a fixed frequency (the IF), usually one lower than the input frequency of the receiver input signal 305. Higher quality filtering is thus attained, resulting in superior receiver performance. A processor may program the first LO synthesizer 312 to the frequency necessary to receive the desired channel. In most receivers the first LO synthesizer 312 is used as the main channel changing local oscillator. The first mixer output 313 is inputted to first IF filter 314, whose output, the first IF output 315 is inputted to analog AFC means 302 and drives the second mixer 316. Second mixer 316 is also driven by second LO synthesizer 328 with second LO output 330. The second mixer output 317 is at the second, and in this case final, IF frequency, which is the difference between the first IF output 315 and the second LO output 330 frequencies. In most double conversion receivers the second LO synthesizer 328 is at a single fixed frequency, but here it is varied as part of the analog AFC means 302. The second mixer output 317 is applied to an IF strip shown in FIG. 9 as a second IF filter 318 and IF amplifier 320. One of ordinary skill in the art understands that in practice there will be multiple gain stages at this final IF stage, and usually multiple filters also. Second IF filter output 319 drives IF amplifier 320. The IF amplifier output 321 is inputted to frequency discriminator 322. Frequency discriminator 322 converts frequency into a voltage representative of frequency, thus demodulating the FM, and is also used to measure frequency error from a desired nominal final IF frequency, and adjusts the second LO synthesizer 328 frequency to compensate for that error. The frequency discriminator output 323 goes to averaging circuit 324 and to demodulator 332. In the demodulator 332 the voltage swings that occur on the frequency discriminator output 323 due to frequency modulation of the transmitting means 1, 50, 100 or 150 (not shown in FIG. 9) are converted into logic level swings, shown here as demodulator output 334. The demodulator output 334 may also be re-timed to be synchronized to an internal expected clock rate, or to a clock rate captured from the data signal 30.

The frequency discriminator output 323, representing instantaneous frequency as a result of frequency error and frequency modulation, is applied to averaging circuit 324, whose purpose is to average out frequency modulation and deliver an output representative only of frequency error. Averaging circuit 324 may be a simple integrator, low pass filter, or a more complex circuit containing integration or filtering in addition to positive and negative peak detectors that provides an average that is less dependent on the data being 50% ones and zeroes. The averaging circuit output 325 is applied to VCXO 326 which provides a crystal reference output 327 for second LO synthesizer 328 with second LO output 330 applied to second mixer 316.

As the output frequency of VCXO 326 changes, the second LO output 330 frequency changes proportionally. The negative feedback character of the system forces the second LO output 330 to track variation in the frequency of the first IF output 315 to the second mixer 316 such that the average frequency of the second mixer output 317 is held constant. So long as frequency error, drift, and modulation remain within the bandwidth of the first IF filter 314, the second IF filter 318, and the frequency discriminator 322, proper demodulation may be maintained. Note that while the first IF filter 314 must be of bandwidth sufficient to allow for any drift or error, the action of the analog AFC means 302 keeps the first IF output 315 centered in the second IF filter 318, allowing second IF filter 318 to be as narrow as the modulation bandwidth of the first IF output 315, and thus for maximum sensitivity to be maintained despite drift and error. Robust communications may thus be maintained over a much larger range of input frequency than can be maintained without this analog AFC means 302.

Receiving means 300 takes advantage of the frequency discriminator 322 to also perform frequency error measurement for the analog AFC means 302. Other methods of achieving similar results are also possible, though probably less circuit efficient.

Loss of signal is a common occurrence in low power wireless communications because mobility, sometimes at both ends of the link, often causes signal blockage or multipath interference that cancels the signal. A vulnerability of the analog AFC means 302 shown in FIG. 9 is that temporary loss of receiver input signal 305 in the receiving means 300 can cause the analog AFC means 302 to lose lock and go unstable. Another drawback is a relatively limited tracking range imposed by the limited tune range of the VCXO 326. Still another drawback is that the AFC system will respond to non 50% duty cycle data as frequency error to correct unless averaging circuit 324 contains positive and negative peak detectors to allow capture of the true modulation midpoint.

Figure 10:
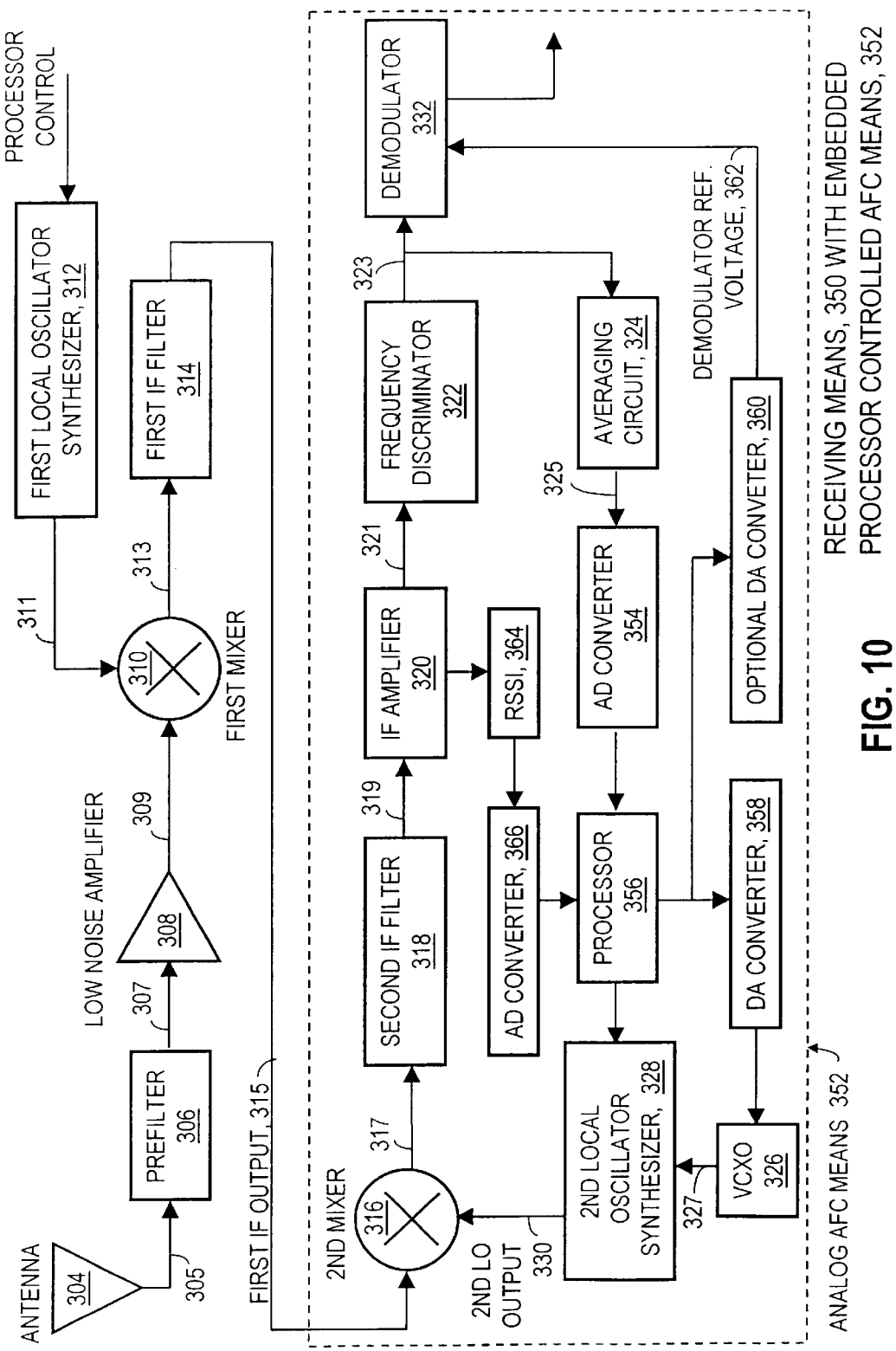
FIG. 10 is a block diagram of a receiving means with automatic frequency control means utilizing a programmable processor in the control loop.

Referring now to FIG. 10 there is shown a block diagram of receiving means 350. The receiving means 350 has a processor controlled AFC means 352. The operation of the receiving means 350 is the same as receiving means 300 in FIG. 9 up to the point of averaging circuit output 325. The processor controlled AFC means 352 in this embodiment corrects for the error in the frequency synthesizer by adapting the steering voltage of VCXO 326 used as the reference and, for greater frequency change, by reprogramming the second LO synthesizer 328 frequency. The frequency error must be known to be corrected which requires converting the error voltage on the averaging circuit output 325 to digital form by inputting it to a first analog to digital (AD) converter 354. Software running in the processor 356 interprets voltage read from the first AD converter 354 as frequency error, which it corrects for by setting the VCXO 326 to the required frequency via first digital-to-analog converter 358. When the VCXO output 327 changes, the second LO output 330 is forced to change proportionally. This allows for changes up to the limit imposed by the allowed tune range of the VCXO 326, the same limit imposed in the analog AFC means of FIG. 9. In this receiving means 350 that limit is known in the processor 356 firmware, and before it is reached the second LO synthesizer 328 may be reprogrammed in conjunction with moving the VCXO 326 frequency back to a mid range value. A small amount of receive data may be lost during this transition, but then low error rate data flow resumes. A wider frequency tracking range is thus provided for.

The presence of Receive Signal Strength Indicator 364 and second AD Converter 366 also allows the processor 356 to monitor the strength of the incoming signal and freeze the second LO synthesizer 328 frequency when the receiver input signal 305 strength drops below a certain level. As soon as the receiver input signal 305 strength recovers, provided the null time is relatively short, normal communications resumes. Use of more sophisticated software that calculates the expected frequency drift over time allows the processor controlled AFC means 352 to continue to move the second LO synthesizer 328 frequency the amount it is expected the transmitting means 1, 50, 100, 150 (not shown in FIG. 10) will drift during the null, so that when the null passes the receiving means 350 is tuned to the correct frequency to immediately allow valid reception.

With the processor in the receiving means 350, other advanced modes becomes practical. For example, for transmissions where the transmitter cannot be held in the open loop condition long enough to transmit the required data in a single burst, the transmitter can periodically re-lock to stay in channel, and then open the loop to transmit more data. With the processor 356 in the processor controlled AFC means 352, the receiving means 350 can be alerted by a flag in the data signal 30 (not shown in FIG. 10) that this re-lock is about to occur. The receiving means 350 is then prepared to jump back to the lock frequency in minimum time. Even without a flag in the data signal 30, the software can learn the lock/re-lock pattern and jump the second LO synthesizer 328 and VCXO 326 back to the appropriate lock values at the time the transmitting means is expected to jump. This general mode of operation overcomes the primary limit of the open loop transmitting means, limited transmit time and data, at the cost of only a minor delay in data transmission during re-lock time. Near real time data flow can continue using the simplest possible synthesized FM transmitting means.

Another advantage of the processor 356 in the loop is the capability for the processor 356 to take into account the duty cycle of the data in the frequency tracking process. This allows averaging circuit 324 to be a simple low pass filter or integrator without peak detectors, and for the AFC system to remain immune to data duty cycle in the tracking process.

The processor in the receiving means 350 of FIG. 10 allows both wide ranging frequency tracking (via reprogramming) and very fine frequency resolution (via tuning the reference). It also allows an additional fine adjustment mode, that of including and adapting a reference voltage, shown in FIG. 10 as demodulator reference voltage 362, via a second DA converter 360 under processor 356 control. This adjustment is not a requirement, since the adjustment of the second LO synthesizer 328 frequency will allow setting of the frequency discriminator output 323 to a suitable DC level, but it does provide an additional degree of control. It is also possible to use adjustment of demodulator reference voltage 362 as a substitute for automatic frequency control in situations where a limited tracking range is sufficient for a given application. This type of operation is referred to as an automatic voltage control (AVC) means, and can be used with or without a processor 356 in the AVC means. The use of the limited performance but still usefull AVC system can allow for the second LO synthesizer 328 to be a non-synthesized source such as a crystal oscillator, and for single channel applications for the first LO synthesizer 312 to be a fixed frequency SAW oscillator of limited frequency accuracy also. These simplifications may be significant in some very low cost applications.

While the preferred embodiments of the invention have been shown and described, it will be apparent to those skilled in this art that various modifications may be made in these embodiments without departing from the teachings of the present invention. Therefore the present invention should not be limited to any single embodiment, but rather construed in scope in accordance with the appended claims.

What is claimed is:

1. A transmitting means for efficient low power radio communication, the transmitting means operates with a certain frequency modulated frequency deviation over a certain carrier frequency range, comprising:

a) DC cancellation mid-point modulation means utilizing a DC compensating signal having a non-modulation state and a modulation state such that said DC compensating signal changes from said non-modulation state to said modulation state upon commencement of modulation and remains in said modulation state so long as modulation continues, and a data signal having a DC voltage content which swings between end points around a nominal mid-point, and having a state prior to modulation commencing opposite to the state of said DC compensating signal:

b) resistive summing circuit which sums said DC compensating signal and said data signal such that the component in the sum due to said DC compensating signal cancels the change in the DC content of the component in the sum due to initiation of modulation by said data signal resulting in a DC cancellation mid-point modulation output whereby the commencement of data modulation begins from said nominal mid-point between said end points of said DC voltage content swing of said data signal and such that there is no change in the average DC level of said DC cancellation mid-point modulation output in said non-modulation and modulation states; and c) frequency synthesizing means incorporating said DC cancellation mid-point modulation means and further comprising a phase locked loop circuit, having open and close loop conditions, with a voltage controlled oscillator having an VCO output of variable frequency, and a loop filter/sample and hold circuit, said loop filter/sample and hold circuit switches said phase lock loop circuit between said open loop and close loop conditions, such that said output signal remains stable and substantially on frequency when said phase locked loop circuit is in said open loop condition, with a minimum of frequency drift over a period of time and whereby said DC cancellation mid-point modulation means causes the frequency deviation of the frequency modulation to vary approximately equally around the desired carrier frequency over which said transmitting means may operate.

* * * * *